(12) United States Patent
Zhang

(10) Patent No.: US 9,464,899 B2
(45) Date of Patent: Oct. 11, 2016

(54) METHOD OF REDUCING GYROSCOPE OSCILLATOR START-UP TIME AND DEVICE THEREFOR

(71) Applicant: mCube Inc., San Jose, CA (US)

(72) Inventor: Wenhua Zhang, San Jose, CA (US)

(73) Assignee: mCube Inc., San Jose, CA (US)

( * ) Notice: Subject to any disclaimer, the term of this patent is extended or adjusted under 35 U.S.C. 154(b) by 194 days.

(21) Appl. No.: 14/497,317

(22) Filed: Sep. 25, 2014

(65) Prior Publication Data

US 2015/0090034 A1   Apr. 2, 2015

Related U.S. Application Data

(60) Provisional application No. 61/883,979, filed on Sep. 27, 2013.

(51) Int. Cl.
*G01C 19/5776* (2012.01)
(52) U.S. Cl.
CPC ... *G01C 19/5776* (2013.01); *B81B 2201/0242* (2013.01); *H03B 2200/0094* (2013.01)
(58) Field of Classification Search
CPC .................. G01C 19/5776; H03B 2200/0094; B81B 2201/0242

USPC ........................................................ 73/504.12
See application file for complete search history.

(56) References Cited

U.S. PATENT DOCUMENTS

| | | | |
|---|---|---|---|
| 8,026,771 B2 * | 9/2011 | Kanai | G01C 19/56 331/158 |
| 8,604,869 B1 * | 12/2013 | Ma | H02M 3/07 327/143 |
| 2010/0077856 A1 * | 4/2010 | Troske | G01C 21/16 73/504.02 |

* cited by examiner

*Primary Examiner* — Justin Olamit
(74) *Attorney, Agent, or Firm* — Kilpatrick Townsend & Stockton LLP

(57) ABSTRACT

A gyroscope device and method of operation therefor. The gyroscope device can include a power input, a charge pump portion coupled to the power input, a selection mechanism, a switching mechanism, an oscillator driving mechanism coupled to the switching mechanism, and an oscillator coupled to the charge pump portion and to the oscillator driving mechanism. The method of operation can include providing a first or second selection signal from a selection mechanism associated with the outputting of a DC input power or DC output power from a switching mechanism, respectively. These signals, along with an oscillator driving signal from an oscillator driving mechanism, can be used to initiate and maintain oscillation of an oscillator at a steady-state frequency within a predetermined range of frequencies.

20 Claims, 7 Drawing Sheets

~17ms

METHOD OF REDUCING GYROSCOPE OSCILLATOR START-UP TIME AND DEVICE THEREFOR

CROSS-REFERENCES TO RELATED APPLICATIONS

The present application is a non-provisional of U.S. Provisional Patent Application No. 61/883,979 filed Sep. 27, 2013 and is related to the following provisional patent applications: U.S. Provisional App. No. 61/757,085, filed Jan. 25, 2013, U.S. Provisional App. No. 61/757,088, filed Jan. 25, 2013, U.S. Provisional App. No. 61/832,657, filed Jun. 7, 2013, and U.S. Provisional App. No. 61/835,510, filed Jun. 14, 2013. These applications are incorporated by reference herein, for all purposes.

BACKGROUND OF THE INVENTION

The present invention is directed to MEMS (Micro-Electro-Mechanical-Systems). More specifically, embodiments of the invention provide methods and structure for improving integrated MEMS devices, including pressure sensors and the like.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods and structure for improving the start-up times of integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much greater range of applicability.

Embodiments of the present invention include a gyroscope device and method of operation therefor. The gyroscope device can include a power input, a charge pump portion coupled to the power input, a selection mechanism, a switching mechanism, an oscillator driving mechanism coupled to the switching mechanism, and an oscillator coupled to the charge pump portion and to the oscillator driving mechanism. The method of operation can include providing a first or second selection signal from a selection mechanism associated with the outputting of a DC input power or DC output power from a switching mechanism, respectively. These signals, along with an oscillator driving signal from an oscillator driving mechanism, can be used to initiate and maintain oscillation of an oscillator at a steady-state frequency within a predetermined range of frequencies.

Many benefits are achieved by way of embodiments of the present invention over conventional techniques. For example, gyroscope sensor devices implementing the voltage switching methods described can benefit from significantly reduced start-up times, which is a critical factor in consumer applications. Depending upon the embodiment, one or more of these benefits may be achieved. These and other benefits will be described in more detail throughout the present specification and more particularly below.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to MEMS (Micro-Electro-Mechanical-Systems). More specifically, embodiments of the invention provide methods and structures for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

In inertial sensor design, such as gyroscope sensors, the inventor has come to believe that start-up time is a critical parameter for consumer electronics applications. An object of the present invention includes a method of operating an inertial sensor to reduce the start-up time of a driving oscillator in a gyroscope sensor. The gyroscope sensor can include a driving oscillator system having a driving mass and MEMS fixed and moving electrodes configured as comb fingers. In a common driving oscillator system, the MEMS fixed comb fingers are biased with a potential, $V_{pm}$, and a sinusoidal or square AC potential is applied to the moving comb fingers. The fixed and moving comb fingers form a driving capacitor, $C_{dr}$. The AC potential, $V_{ac}$, is designed to have a zero to maximum of $V_{dd}$, a system power supply potential. The amplitude of the AC signal is set by system settings in a typical control loop fashion. A typical $V_{dd}$ in a consumer electronics computer is about 1.8 to 2.4V, while the $V_{pm}$ can be charge-pumped to as high as 15V to 30V.

Figure 1:
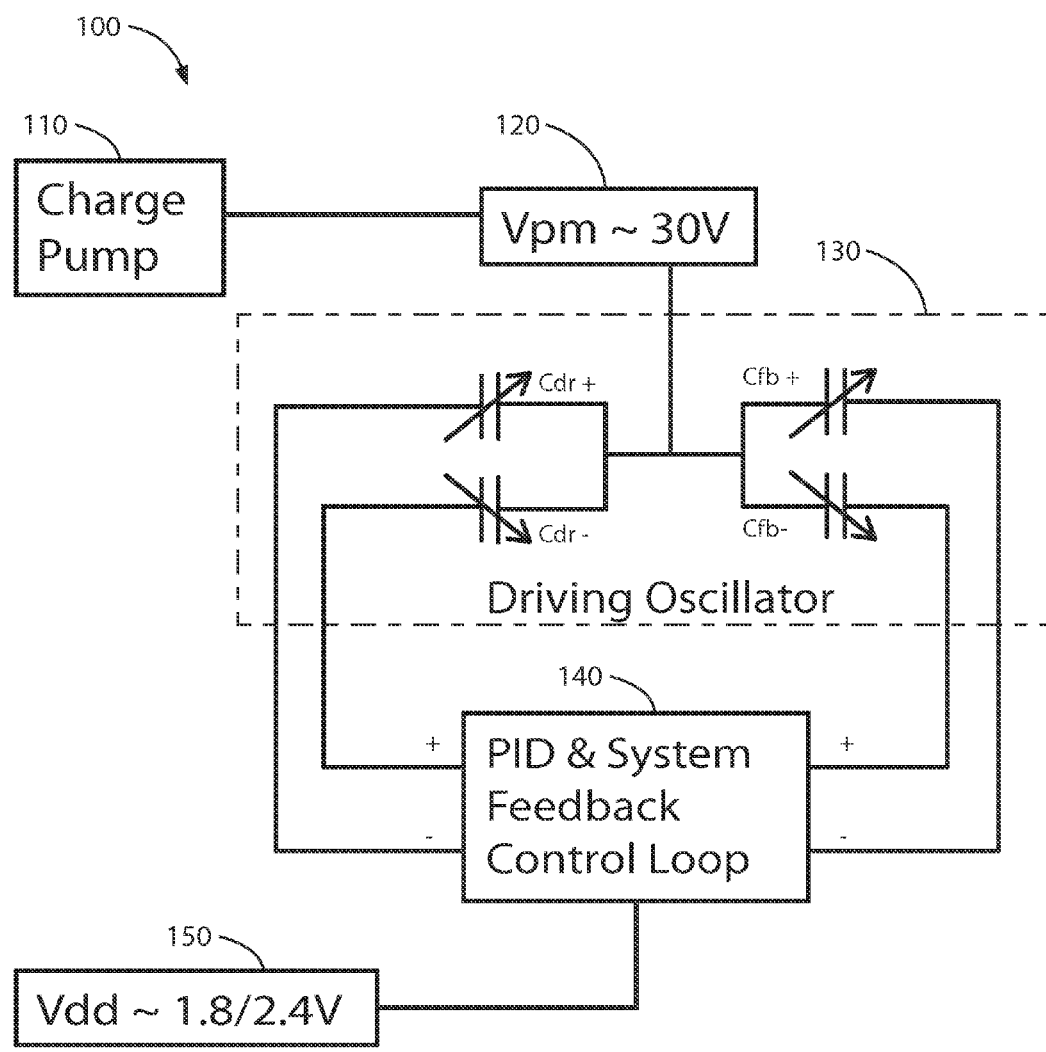
FIG. 1 is a simplified diagram illustrating a conventional driving loop system.

FIG. 1 is a simplified diagram illustrating a conventional driving loop system. As shown, the driving loop system 100 includes a charge pump 110, a bias source 120 ($V_{pm}$), a driving oscillator 130, a feedback control loop block 140, and a power input 150 ($V_{dd}$). The charge pump 110 is coupled to the bias source 120, which is coupled to the driving oscillator 130. The oscillator 130 is coupled to the PID & System feedback control loop 140, which is coupled to the power input 150. Here, the control block power supply or power input 150 is $V_{dd}$.

In a typical feedback loop system design, the driving mass will oscillate when the AC potential signal has a frequency at a driving oscillator resonance frequency. For a driving resonator with high quality factor, Q>5000, the start-up time is more than 100 ms even with a classic PID control. In this case, the start-up time is defined as 1% of the final steady oscillation amplitude. A factor contributing to the long rising time is due to low driving feedback block power supply voltage, $V_{dd}$, and hence low driving voltage, $V_{ac}$. Over designing PID parameters will result in system oscillation or over-shooting, and both of these cases will not help to stabilize the system.

Figure 2:
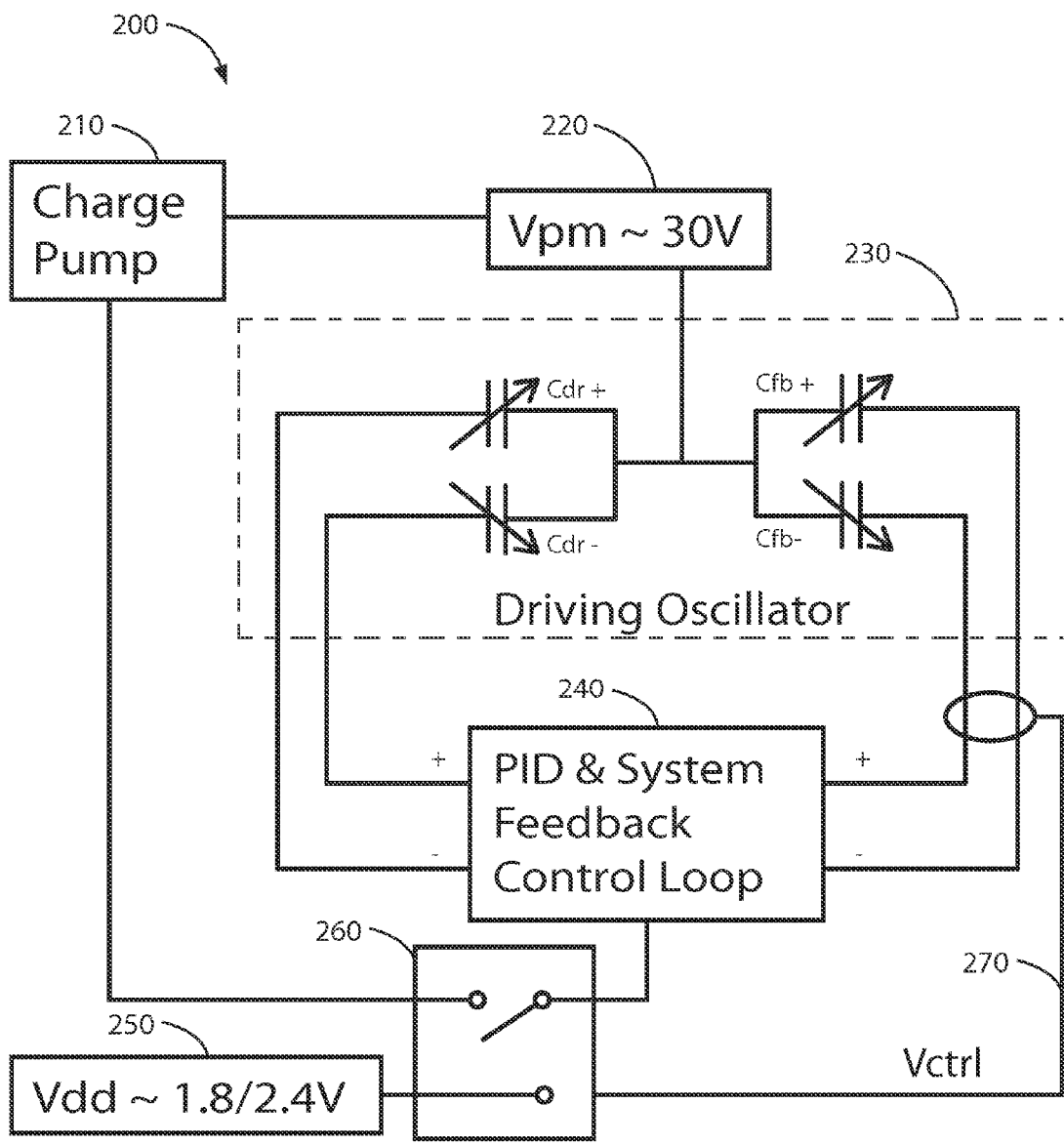
FIG. 2 is a simplified diagram illustrating a driving loop system according to an embodiment of the present invention.

FIG. 2 is a simplified diagram illustrating a driving loop design according to an embodiment of the present invention. In this case, the control block power supply is from the charge pump. As shown, driving loop system 200 includes a charge pump 210, a bias source 220 ($V_{pm}$), a driving oscillator 230, a feedback control loop 240, a power input 250 ($V_{dd}$), a switching mechanism 260, and a selection mechanism 270. Similar to the conventional feedback loop system of FIG. 1, the charge pump 210 is coupled to the bias source 220, which is coupled to the driving oscillator 230. The driving oscillator 230 is coupled to the PID & system feedback control loop 240, but in this embodiment the control loop 240 is coupled to a switching mechanism 260. This mechanism is coupled to the charge pump 210, the $V_{dd}$ source 250, and the selection mechanism 270. Here, the selection mechanism 270 is coupled to the end of the oscillator 230 on the driving oscillator output end. When the driving oscillator output reaches a certain amplitude, the switch will change to Vdd as the power supply.

In various embodiments, the present invention provides gyroscope sensor devices with an added switch to use the highest potential in the system as the AC power supply during the earlier period of start-up of the gyroscope, e.g., the initial 10 ms. Here, the highest $V_{ac}$ will be as high as $V_{pm}$ in some embodiments. Since the load-induced fluctuation of $V_{pm}$, which will share the power supply from a charge pump with $V_{ac}$, only happens at the start up time, the steady-state performance of the gyroscope sensor device will not be affected. As the driving oscillator reaches a certain amplitude, the switch can change to and maintain $V_{dd}$ as the power supply and charge pump will only supply power for $V_{pm}$. Thus, during regular operation, sensor performance will not be affected due to overloading on the charge pump. The threshold of the switch may use the actual driving oscillator amplitude or the actual PID output control parameter to control the switch.

Figure 3:
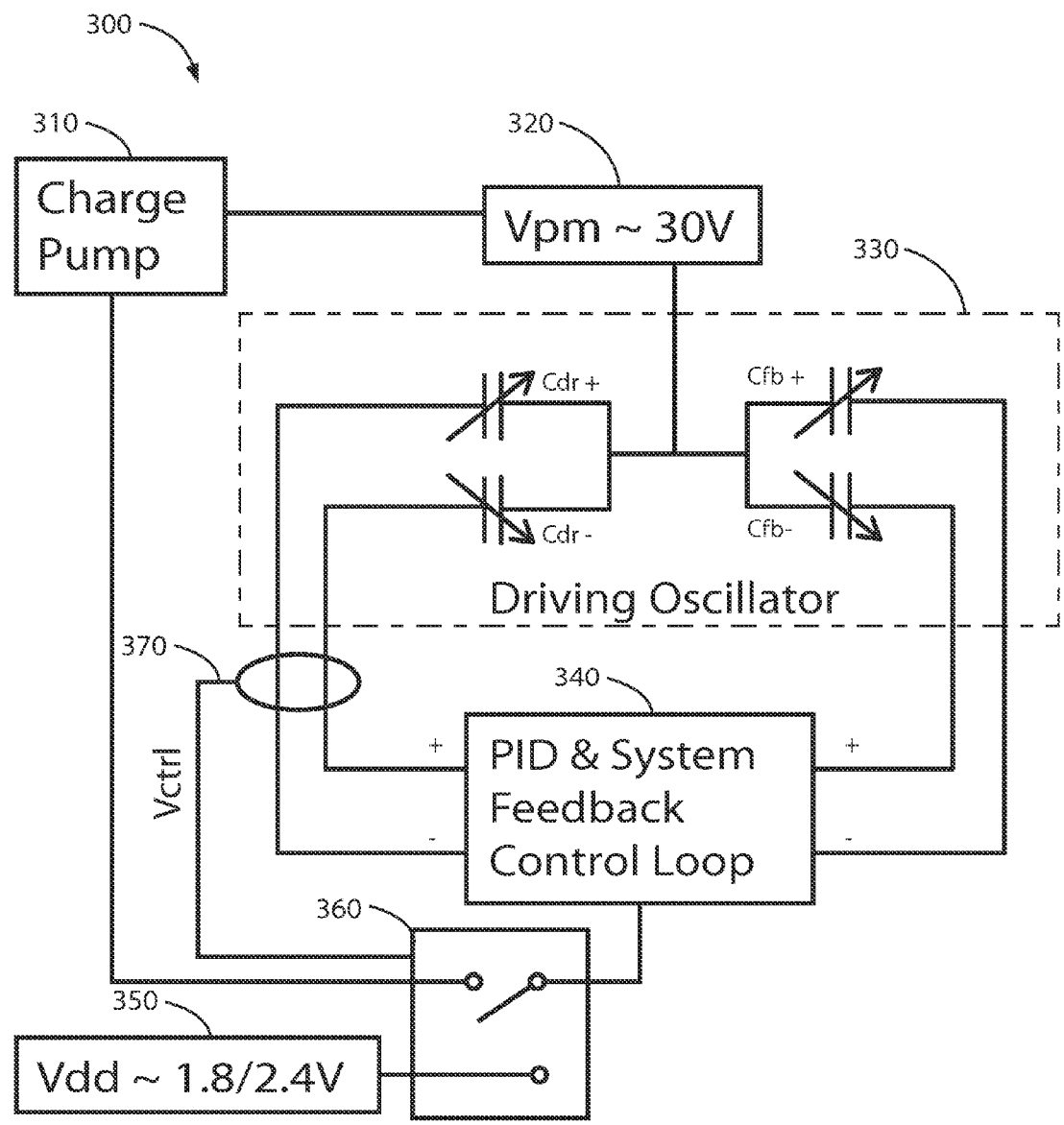
FIG. 3 is a simplified diagram illustrating a driving loop system according to an embodiment of the present invention.

FIG. 3 is a simplified diagram illustrating a driving loop design according to an embodiment of the present invention. In this case, the switch is controlled by the driving oscillator input. As shown, driving loop system 300 is similar to that of FIG. 2 with a charge pump 310, a $V_{pm}$ source 320, a driving oscillator 330, a feedback control loop 340, a $V_{dd}$ source 350, a switching mechanism 360, and a selection mechanism 370. A difference between the system of FIG. 2 and FIG. 3 is that the control line 370 is coupled to the oscillator 330 on the driving oscillator input end.

In various embodiments, the present invention provides gyroscope sensor devices with an added switch to use the highest potential in the system as the AC power supply during the earlier period of start-up of the gyroscope, e.g. the initial 10 ms. Here, the highest $V_{ac}$ will be as high as $V_{pm}$ in some embodiments. Since the load-induced fluctuation of $V_{pm}$, which will share the power supply from a charge pump with $V_{ac}$, only happens at the start up time, the steady-state performance of the gyroscope sensor device will not be affected. As the driving oscillator reaches a certain amplitude, the switch can change to and maintain $V_{dd}$ as the power supply and charge pump will maintain supply power for $V_{pm}$. Thus, during regular operation, sensor performance will not be affected due to overloading on the charge pump. The threshold of the switch may use the actual driving oscillator amplitude or the actual PID output control parameter to control the switch.

Figure 4:
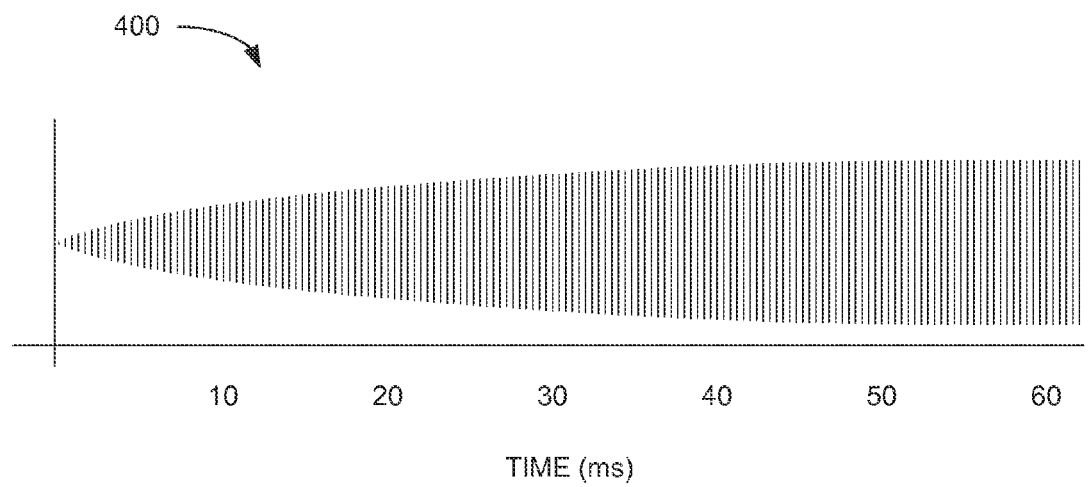
FIG. 4 is a simplified graph of a simulation for a conventional power supply.
Figure 5:
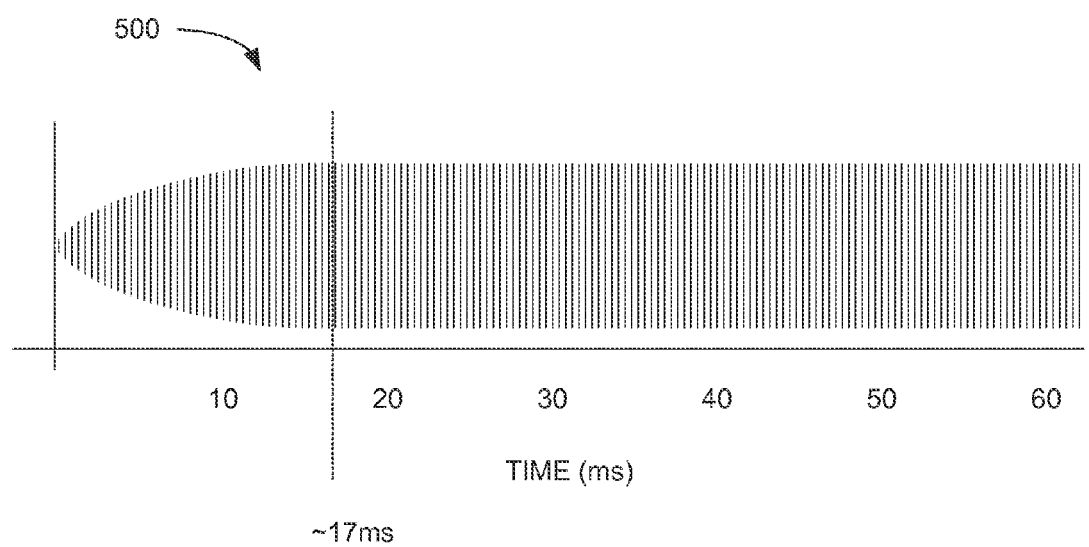
FIG. 5 is a simplified graph of a simulation for a power supply according to an embodiment of the present invention.

FIG. 4 is a simplified graph of a simulation for a conventional power supply. Graph 400 shows the start-up time of the conventional power supply configuration of a driving loop oscillator, depicted in FIG. 1, to be more than 70 ms until a steady state is achieved. FIG. 5 is a simplified graph of a simulation for a power supply according to various embodiments of the present invention. Here, the simulations for the configurations of the driving oscillator systems of FIG. 2 or 3 are shown to exhibit start-up times less than 17 ms, which is a significant improvement over the conventional model. The dotted line overlying graph 500 shows the point at which the voltage output is within 1% of the steady-state oscillation amplitude, which was previously defined as the measuring point for the start-up time.

Figure 6:
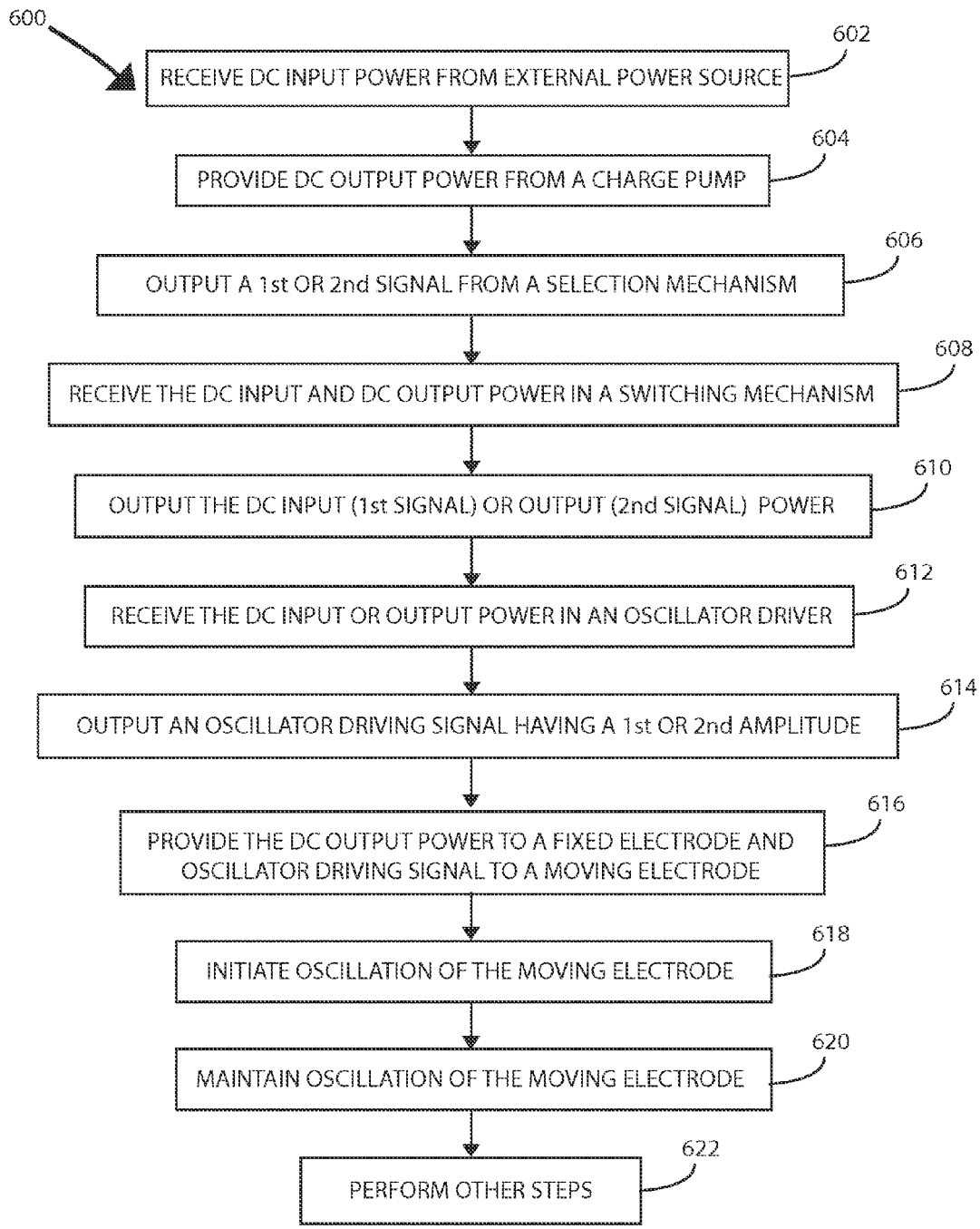
FIG. 6 is a simplified flow diagram of a method for operating an inertial sensing device according to an embodiment of the present invention.

FIG. 6 is a simplified flow diagram of a method for operating an inertial sensing device according to an embodiment of the present invention. As shown, the method 600 can be include the following steps:

602. receive DC input power from an external power source, wherein the DC input power comprises a first voltage amplitude;

604. provide a DC output power from a charge pump, wherein the DC output power comprises a second voltage amplitude, wherein the second voltage amplitude is greater than the first voltage amplitude;

606. output, from a selection mechanism, a first selection signal or a second selection signal;

608. receive, in a switching mechanism, the DC input power from the external power source or the DC output power from the charge pump;

610. output, from the switching mechanism, the DC input power in response to a first selection signal, or the DC output power, in response to a second selection signal;

612. receive, in an oscillator driving mechanism, the DC input power or the DC output power;

614. output, from the oscillator driving mechanism, an oscillator driving signal having a first amplitude in response to the DC input power or having a second amplitude in response to the DC output power, wherein the second amplitude is greater than the first amplitude;

616. provide, to an oscillator comprising a fixed electrode and a moving electrode, the DC output power for the fixed electrode and the oscillator driving signal for the moving electrode;

618. initiate oscillation of the moving electrode with respect to the fixed electrode in the oscillator in response to the DC output power and to the oscillator driving signal;

620. maintain oscillation of the moving electrode with respect to the fixed electrode to a steady-state frequency within a predetermined range of frequencies; and 622. Other steps as desired.

These steps are merely examples and should not unduly limit the scope of the claims herein. One of ordinary skill in the art would recognize many other variations, modifications, and alternatives. For example, various steps outlined above may be added, removed, modified, rearranged, repeated, and/or overlapped, as contemplated within the scope of the invention.

In an embodiment, the present invention can include the method 600 for operating a gyroscope. The method can begin with step 602, receiving DC input power from an external power source. The DC input power can include a first voltage amplitude. DC output power can be provided from a charge pump, step 604. The DC output power can include a second voltage amplitude that is greater than the first voltage amplitude. In a specific embodiment, the first voltage amplitude can be within a range of about 1.8 to about 2.4 volts and the second voltage amplitude can be within a range of about 5 to about 30 volts.

A first selection signal or a second selection signal can be outputted from a selection mechanism, step 606. In a specific embodiment, the outputting the selection signals can include outputting the second selection signal for a first period of time and then outputting the first selection signal. The first selection signal can be outputted before the second selection signal, or other timing patterns can be used as well. The first period of time can be within a range of about 5 milliseconds to about 20 milliseconds.

In a specific embodiment, the method 606 can include monitoring a given parameter in the selection mechanism. Considering the outputting the selection signals from the selection mechanism, threshold values of various parameters can be used to determine the type of outputted selection signal. For example, with the parameter being a given frequency of the oscillator, the second selection signal can be outputted when the oscillator frequency is below a threshold frequency and the first selection signal can be outputted when the frequency is above the threshold frequency. The threshold frequency can be a fraction of the given frequency. In the case in which the given parameter is an oscillation amplitude of the oscillator, the second selection signal can be outputted when the amplitude is below a threshold amplitude and the first selection signal can be outputted when the amplitude is above the threshold amplitude. The threshold amplitude can be less than or equal to the first voltage amplitude. In various embodiments, other monitored parameters and threshold values can be used, such as the oscillator driving signal.

A switching mechanism can be used to receive the output from the selection mechanism, step 612. In the first selection signal case, the DC input power is received from the external power source. In the second selection signal case, the DC output power is received from the charge pump. A switching mechanism can be used to output a response to the selection signal, step 610. The DC input power can be output in response to the first selection signal or the DC output power can be output in response to the second selection signal.

An oscillator driving mechanism can be used to receive the output from the switching mechanism, step 612. Then, the oscillator driving mechanism can be used to output an oscillator driving signal in response to the output from the switching mechanism, step 614. The oscillator driving signal can have a first amplitude in response to the DC input power or a second amplitude in response to the DC output power. The DC output power and the oscillator driving signal can be provided to an oscillator, step 616. The oscillator can have a fixed electrode and a moving electrode. The DC output power can be provided to the fixed electrode and the oscillator driving signal can be provided to the moving electrode.

An oscillation of the moving electrode can be initiated with respect to the fixed electrode in the oscillator in response to the DC output power and to the oscillator driving signal, step 618. This oscillation can be maintained to a steady-state frequency within a predetermined range of frequencies, step 620. In a specific embodiment, the steady-state frequency can be within a range of about 2 KHz to about 100 KHz. Other steps can be performed as desired, step 622.

Figure 7:
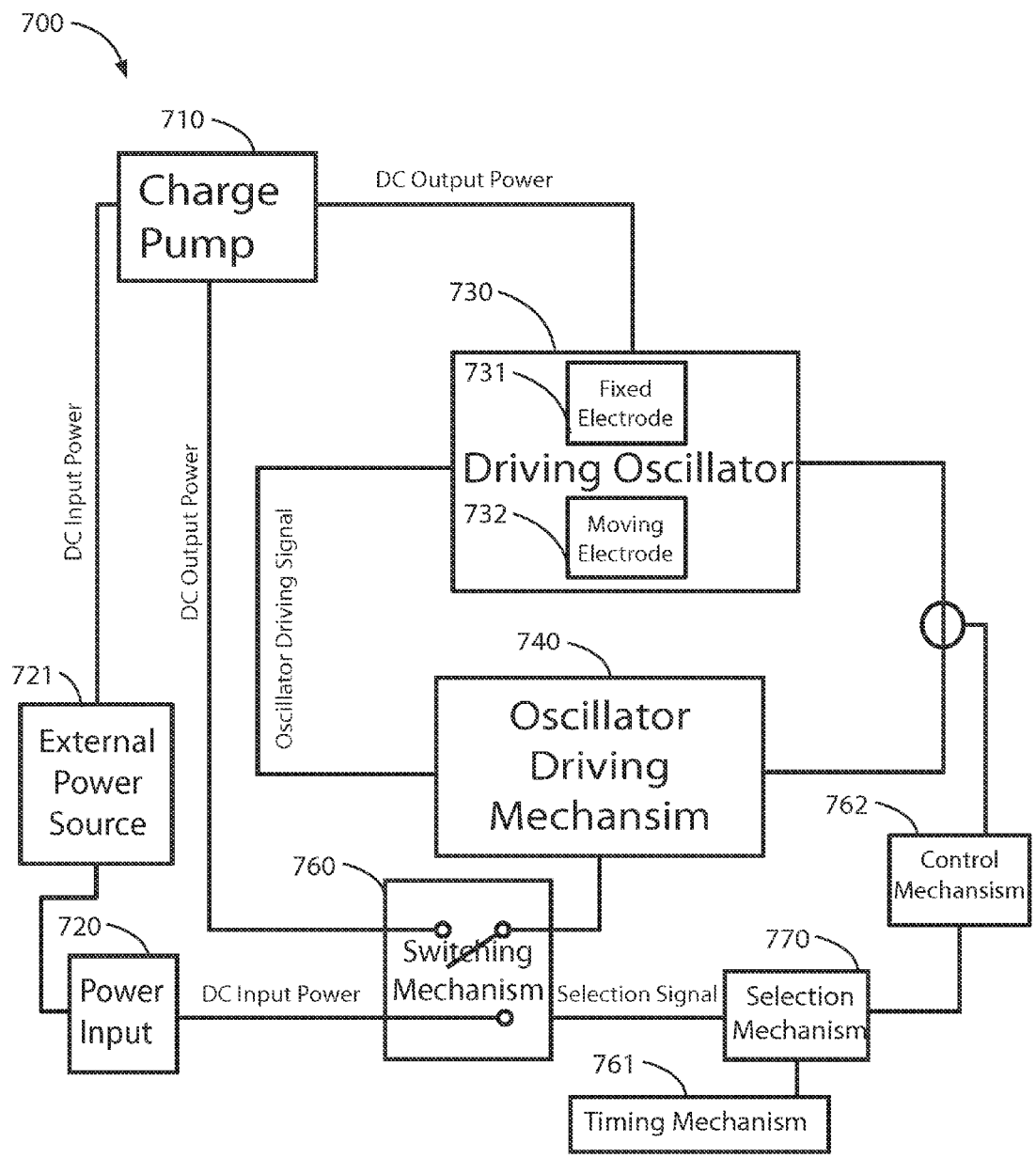
FIG. 7 is a simplified diagram of an inertial sensing device according to an embodiment of the present invention.

FIG. 7 is a simplified diagram of an inertial sensing device according to an embodiment of the present invention. As shown, gyroscope device 700 can include a power input 720, a charge pump portion 710 coupled to the power input 720, a selection mechanism 770, a switching mechanism 760, an oscillator driving mechanism 740 coupled to the switching mechanism 760, and an oscillator 730 coupled to the charge pump portion 710 and to the oscillator driving mechanism 740.

In an embodiment, the power input 720 can be configured to receive DC input power from an external power source 721. The DC input power can include a first voltage amplitude. The charge pump portion 710 can be configured to receive the DC input power from the external power source 721 and to provide DC output power. The DC output power can include a second voltage amplitude. In a specific embodiment, the second voltage amplitude is greater than the first voltage amplitude. The first voltage amplitude of the DC input power can be within a range of about 1.8 to about 2.4 volts and the second voltage amplitude of the DC output power can be within a range of about 5 to about 30 volts. Other voltage ranges can be used as well.

In an embodiment, the selection mechanism 770 can be configured to provide a first selection signal or a second selection signal. The selection mechanism 770 can be coupled to the switching mechanism 760, which can also be coupled to the power input 720 and to the charge pump portion 710. The switching mechanism 760 can be configured to receive the DC input power and the DC output power and can be configured to output the DC input power in response to the first selection signal and output the DC output power in response to the second selection signal.

In an embodiment, the oscillator driving mechanism 740 can be configured to receive either the DC input power or the DC output power from the switching mechanism 760. The oscillator driving mechanism 740 can be configured to output an oscillator driving signal having a first amplitude in response to the DC input power or an oscillator driving signal having a second amplitude in response to the DC output power. In a specific embodiment, the second amplitude is greater than the first amplitude. In a specific embodiment, the oscillator driving mechanism 740 can be configured to output the oscillator driving signal having an amplitude within a range of about 5 volts to about 30 volts in response to the DC output power or having an amplitude within a range of about 1.8 to about 2.4 volts in response to the DC input power.

In an embodiment, the oscillator 730 can include a fixed electrode 731 and a moving electrode 732. The fixed electrode 731 can be configured to receive the DC output power. The moving electrode 732 can be configured to receive the oscillator driving signal. In a specific embodiment, the oscillator 730 can be configured to oscillate in a steady-state at a given frequency in response to the DC output power and in response to the oscillator driving signal. The oscillator can also be configured to oscillate at a steady state frequency within a range of about 2 KHz to about 100 KHz. Other frequency ranges can be used as well.

In a specific embodiment, the gyroscope device 700 can include a timing mechanism 761 coupled to the switching mechanism 760. The timing mechanism 761 can be coupled or configured with the selection mechanism 770. The timing mechanism 761 can be configured to output the second selection signal for a first period of time and then configured to output the first selection signal. In other embodiments, the first selection signal can be outputted first followed by the second selection signal. Other timing patterns in which the selection signals are switched at various intervals can be used as well. In a specific embodiment, the first time period can be within a range of about 5 milliseconds to about 20 milliseconds, but can be others.

In a specific embodiment, the gyroscope device 700 can include a control mechanism 762 coupled to the switching mechanism 760 and to the oscillator 740. The control mechanism 762 can be coupled or configured with the selection mechanism 770. The control mechanism 762 can be configured to monitor a given frequency of the oscillator and can be configured to output the second selection signal when the given frequency of the oscillator is below a threshold frequency and to output the first selection signal when the given frequency of the oscillator is above the threshold frequency. The configured output can be reversed for the given frequency of the oscillator being below or above the threshold frequency as well. In a specific embodiment, the threshold frequency can be a fraction of the given frequency.

The control mechanism 762 can also be configured to monitor an oscillation amplitude of the oscillator. Similar to the threshold frequency, the control mechanism 762 can be configured to output the second selection signal when the oscillation amplitude of the oscillator 730 is below a threshold amplitude and to output the first selection signal when the oscillation amplitude of the oscillator 730 is above the threshold amplitude, or vice versa. In a specific embodiment, the threshold amplitude is less than or equal to the first voltage amplitude, but can be others. In other embodiments, control mechanism 762 may monitor the oscillator driving signal.

Figure 8:
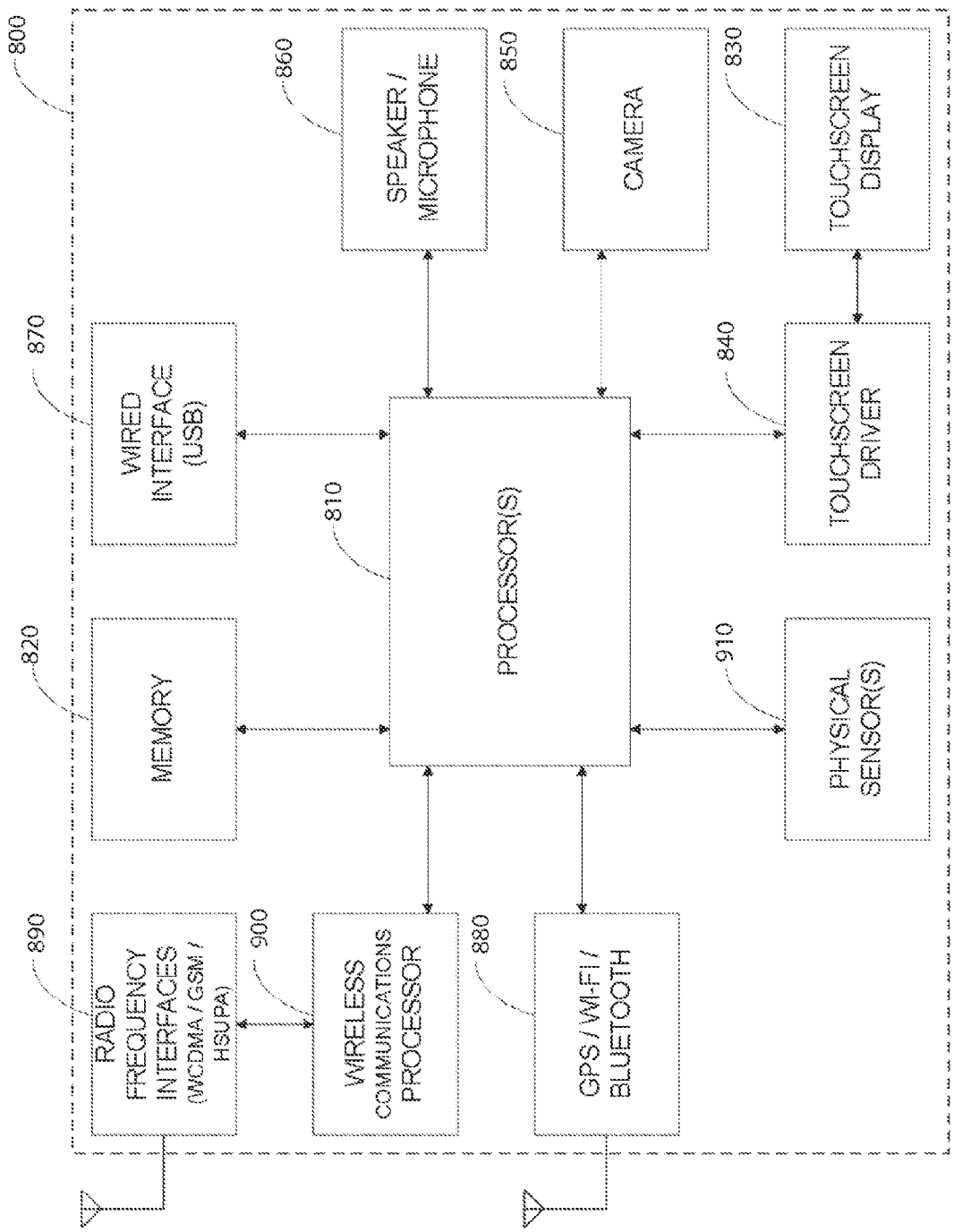
FIG. 8 illustrates a simplified functional block diagram of various embodiments of the present invention.

FIG. 8 illustrates a functional block diagram of various embodiments of the present invention. In FIG. 8, a computing device 800 typically includes an applications processor 810, memory 820, a touch screen display 830 and driver 840, an image acquisition device 850, audio input/output devices 860, and the like. Additional communications from and to computing device are typically provided by via a wired interface 870, a GPS/Wi-Fi/Bluetooth interface 880, RF interfaces 890 and driver 900, and the like. Also included in various embodiments are physical sensors 910.

In various embodiments, computing device 800 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 800 may include one or more processors 810. Such processors 810 may also be termed application processors, and may include a processor core, a video/graphics core, and other cores. Processors 810 may be a processor from Apple (A8), Intel (Atom), NVidia (Tegra), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 820 may include different types of memory (including memory controllers), such as flash memory (e.g. NOR, NAND), pseudo SRAM, DDR SDRAM, or the like. Memory 820 may be fixed within computing device 800 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 830 and driver 840 may be based upon a variety of later-developed or current touch screen technology including resistive displays, capacitive displays, optical sensor displays, electro-magnetic resonance, or the like. Additionally, touch screen display 830 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 850 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 860 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 810 to enable the user to operate computing device 800 by stating voice commands. Additionally, a speech engine may be provided in various embodiments to enable computing device 800 to provide audio status messages, audio response messages, or the like.

In various embodiments, wired interface 870 may be used to provide data transfers between computing device 800 and an external source, such as a computer, a remote server, a storage network, another computing device 800, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 880 may also be provided to provide wireless data transfers between computing device 800 and external sources, such as computers, storage networks, headphones, microphones, cameras, or the like. As illustrated in FIG. 8, wireless protocols may include Wi-Fi (e.g. IEEE 802.11 a/b/g/n, WiMax), Bluetooth, IR and the like.

GPS receiving capability may also be included in various embodiments of the present invention, however is not required. As illustrated in FIG. 8, GPS functionality is included as part of wireless interface 880 merely for sake of convenience, although in implementation, such functionality is currently performed by circuitry that is distinct from the Wi-Fi circuitry and distinct from the Bluetooth circuitry.

Additional wireless communications may be provided via RF interfaces 890 and drivers 900 in various embodiments. In various embodiments, RF interfaces 890 may support any future-developed or conventional radio frequency communications protocol, such as CDMA-based protocols (e.g. WCDMA), GSM-based protocols, HSUPA-based protocols, or the like. In the embodiments illustrated, driver 900 is illustrated as being distinct from applications processor 810. However, in some embodiments, these functionality are provided upon a single IC package, for example the Marvel PXA330 processor, and the like. It is contemplated that some embodiments of computing device 800 need not include the RF functionality provided by RF interface 890 and driver 900.

FIG. 8 also illustrates computing device 800 to include physical sensors 910. In various embodiments of the present invention, physical sensors 910 can be single axis or multi-axis Micro-Electro-Mechanical Systems (MEMS) based devices being developed by M-cube, the assignee of the present patent application. Physical sensors 910 can include accelerometers, gyroscopes, pressure sensors, magnetic field sensors, bio sensors, and the like. In other embodiments of the present invention, conventional physical sensors 910 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 830 and driver 840 and inputs/or outputs to physical sensors 910 may be processed in parallel processing threads. In other embodiments, such events or outputs may be processed serially, or the like. Inputs and outputs from other functional blocks may also be processed in parallel or serially, in other embodiments of the present invention, such as image acquisition device 850 and physical sensors 910.

FIG. 8 is representative of one computing or micro-processing device 800 capable of embodying the present invention. In one embodiment, the DOC can be implanted on chip with sensors instead of using an external processor. The previously described methods of operation can be implemented with on-chip logic or through a micro-processor in the same device or in a separate chip within the hand-held device. It will be readily apparent to one of ordinary skill in the art that many other hardware and software configurations are suitable for use with the present invention. Embodiments of the present invention may include at least some but need not include all of the functional blocks illustrated in FIG. 8. For example, in various embodiments, computing device 800 may lack image acquisition unit 850, or RF interface 890 and/or driver 900, or GPS capability, or the like. Additional functions may also be added to various embodiments of computing device 800, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A gyroscope with reduced start-up time comprising:
a power input configured to receive DC input power from an external power source, wherein the DC input power comprises a first voltage amplitude;
a charge pump portion coupled to the power input, wherein the charge pump portion is configured to receive the DC input power from the external power source, and configured to provide DC output power, wherein the DC output power comprises a second voltage amplitude, wherein the second voltage amplitude is greater than the first voltage amplitude;
a selection mechanism configured to provide a first selection signal or a second selection signal;
a switching mechanism coupled to the power input, to the charge pump portion, and to the selection mechanism, wherein the switching mechanism is configured to receive the DC input power and the DC output power, wherein the switching mechanism is configured to output the DC input power in response to the first selection signal, and wherein the switching mechanism is configured to output the DC output power, in response to the second selection signal;
an oscillator driving mechanism coupled to the switching mechanism, wherein the oscillator driving mechanism is configured to receive either the DC input power or the DC output power from the switching mechanism, wherein the oscillator driving mechanism is configured to output an oscillator driving signal having a first amplitude in response to the DC input power or having a second amplitude in response to the DC output power, wherein the second amplitude is greater than the first amplitude; and
an oscillator coupled to the charge pump portion and to the oscillator driving mechanism, wherein the oscillator comprises a fixed electrode and a moving electrode, wherein the fixed electrode is configured to receive the DC output power, wherein the moving electrode is configured to receive the oscillator driving signal, and wherein the oscillator is configured to oscillate in a steady-state at a given frequency in response to the DC output power and in response to the oscillator driving signal.

2. The gyroscope of claim 1 further comprising a timing mechanism coupled to the switching mechanism, wherein the timing mechanism is configured to output the second selection signal for a first period of time and then configured to output the first selection signal.

3. The gyroscope of claim 2 wherein the first period of time is within a range of about 5 milliseconds to about 20 milliseconds.

4. The gyroscope of claim 1 further comprising a control mechanism coupled to the switching mechanism and to the oscillator, wherein the control mechanism is configured to monitor a given frequency of the oscillator, wherein the control mechanism is configured to output the second selection signal when the given frequency of the oscillator is below a threshold frequency, and wherein the control mechanism is configured to output the first selection signal when the given frequency of the oscillator is above the threshold frequency.

5. The gyroscope of claim 4 wherein the threshold frequency is a fraction of the given frequency.

6. The gyroscope of claim 1 further comprising a control mechanism coupled to the switching mechanism and to the oscillator, wherein the control mechanism is configured to monitor an oscillation amplitude of the oscillator, wherein the control mechanism is configured to output the second selection signal when the oscillation amplitude of the oscillator is below a threshold amplitude, and wherein the control mechanism is configured to output the first selection signal when the oscillation amplitude of the oscillator is above the threshold amplitude.

7. The gyroscope of claim 6 wherein the threshold amplitude is less than or equal to the first voltage amplitude.

8. The gyroscope of claim 1
wherein the first voltage amplitude of the DC input power is within a range of about 1.8 to about 2.4 volts; and
wherein the second voltage amplitude of the DC output power is within a range of about 5 to about 30 volts.

9. The gyroscope of claim 1 wherein the oscillator is configured to oscillate at a steady-state frequency within a range of about 2 KHz to about 100 KHz.

10. The gyroscope of claim 1 wherein the oscillator driving mechanism is configured to output the oscillator driving signal having an amplitude within a range of about 5 volts to about 30 volts in response to the DC output power or having an amplitude within a range of about 1.8 to about 2.4 volts in response to the DC input power.

11. A method for operating a gyroscope comprising:
receiving DC input power from an external power source, wherein the DC input power comprises a first voltage amplitude;
providing a DC output power from a charge pump, wherein the charge pump is configured to receive the DC input power from the external power source, wherein the DC output power comprises a second voltage amplitude, wherein the second voltage amplitude is greater than the first voltage amplitude;
outputting, from a selection mechanism, a first selection signal or a second selection signal;
receiving, in a switching mechanism, the DC input power from the external power source and the DC output power from the charge pump;
outputting, from the switching mechanism, the DC input power in response to a first selection signal, or the DC output power, in response to a second selection signal;
receiving, in an oscillator driving mechanism, the DC input power or the DC output power;
outputting, from the oscillator driving mechanism, an oscillator driving signal having a first amplitude in response to the DC input power or having a second amplitude in response to the DC output power, wherein the second amplitude is greater than the first amplitude;
providing, to an oscillator comprising a fixed electrode and a moving electrode, the DC output power for the fixed electrode and the oscillator driving signal for the moving electrode;
initiating oscillation of the moving electrode with respect to the fixed electrode in the oscillator in response to the DC output power and to the oscillator driving signal; and
maintaining oscillation of the moving electrode with respect to the fixed electrode at a steady-state frequency within a predetermined range of frequencies in response to the DC input power and in response to the oscillator driving signal.

12. The method of claim 11 wherein
outputting, from the selection mechanism, a first selection signal or a second selection signal comprises outputting the second selection signal for a first period of time and then the first selection signal.

13. The method of claim 12 wherein the first period of time is within a range of about 5 milliseconds to about 20 milliseconds.

14. The method of claim 11 further comprising
monitoring, in the selection mechanism, a given frequency of the oscillator; and
wherein outputting, from the selection mechanism, the first selection signal or the second selection signal comprises:
outputting the second selection signal when the given frequency of the oscillator is below a threshold frequency; and
outputting the first selection signal when the given frequency of the oscillator is above the threshold frequency.

15. The method of claim 14 wherein the threshold frequency is a fraction of the given frequency.

16. The method of claim 11 further comprising
monitoring, in the selection mechanism, an oscillation amplitude of the oscillator; and
wherein outputting, from the selection mechanism, the first selection signal or the second selection signal comprises:
outputting the second selection signal when the oscillation amplitude of the oscillator is below a threshold amplitude; and
outputting the second selection signal when the oscillation amplitude of the oscillator is above the threshold amplitude.

17. The method of claim 16 wherein the threshold amplitude is less than or equal to the first voltage amplitude.

18. The method of claim 11
wherein the first voltage amplitude of the DC input power is within a range of about 1.8 to about 2.4 volts; and
wherein the second voltage amplitude of the DC output power is within a range of about 5 to about 30 volts.

19. The method of claim 11 wherein the steady-state frequency is within a range of about 2 KHz to about 100 KHz.

20. The method of claim 11 wherein the oscillator driving signal comprises an amplitude within a range of about 5 volts to about 30 volts in response to the DC output power or an amplitude within a range of about 1.8 volts to about 2.4 volts in response to the DC input power.

* * * * *